United States Patent [19]

Wittwer

[11] 4,402,063
[45] Aug. 30, 1983

[54] FLIP-FLOP DETECTOR ARRAY FOR MINIMUM GEOMETRY SEMICONDUCTOR MEMORY APPARATUS

[75] Inventor: Norman C. Wittwer, Oldwick, N.J.

[73] Assignee: Bell Telephone Laboratories, Incorporated, Murray Hill, N.J.

[21] Appl. No.: 306,217

[22] Filed: Sep. 28, 1981

[51] Int. Cl.³ .............................................. G11C 11/40
[52] U.S. Cl. ...................................... 365/154; 365/205
[58] Field of Search ............... 365/149, 154, 189, 190, 365/202, 205; 307/530

[56] References Cited

U.S. PATENT DOCUMENTS 3,678,473 7/1972 Wahlstrom ......................... 365/149
4,351,034 9/1982 Eaton, Jr. et al. .................. 365/189

OTHER PUBLICATIONS

Electronics, "Maximizing a 64-K RAM's Operating Margins," pp. 197–201, Apr. 21, 1981.
K. J. O'Connor Case 1, Ser. No. 234,453 Filed Feb. 13, 1981.

Primary Examiner—Joseph A. Popek
Attorney, Agent, or Firm—David I. Caplan

[57] ABSTRACT

This invention furnishes a minimum geometry integrated circuit arrangement of flip-flop detectors for a random access memory array in MOS (metal oxide semiconductor) technology. By "minimum geometry" is meant that these flip-flops occupy no more lateral space than the memory cells occupy even when every cell is built within a lateral space of only twice the minimum feature size, that is, a space of twice the minimum width of a metallization line.

12 Claims, 11 Drawing Figures

LEGEND

| STRIPES | | CONTACTS | |
|---|---|---|---|
| ▨ | METAL | ▢ | METAL TO POLYSILICON |
| ☐ | POLYSILICON | ▭ | DIFFUSION TO POLYSILICON |
| ▩ | DIFFUSION | ▣ | METAL TO DIFFUSION |

| FIG. 3 | FIG. 4 | LEFT-HALF MEMORY ARRAY | FIG. 1 | RIGHT-HALF MEMORY ARRAY | FIG. 5 |

| FIG. 7 | FIG. 8 |

FLIP-FLOP DETECTOR ARRAY FOR MINIMUM GEOMETRY SEMICONDUCTOR MEMORY APPARATUS

FIELD OF THE INVENTION

This invention relates to the field of semiconductor apparatus, and more particularly to MOS (metal oxide semiconductor) memory arrays.

BACKGROUND OF THE INVENTION

In the prior art, a useful layout of MOS random access memories at a major surface of a semiconductive silicon body comprises a pair of complementary two-dimensional arrays (A, $\overline{A}$) of MOS capacitive memory cells, with a one dimensional (linear) array of flip-flop sense amplifier detectors situated betwee the arrays. More specifically, each such two-dimensional memory array comprises a rectangular matrix of N rows ("bit" lines) and M columns ("word" lines)—that is, a total of 2MN memory cells for the pair of arrays. A separate storage cell is located at each crosspoint of a bit line and a word line. Each of the flip-flop detectors, a total of N in number, connects a corresponding bit line ($B_j$, with $j=1, 2, 3 \ldots N$; i.e. $B_1, B_2, B_3, \ldots B_N$) in one of the rectangular memory arrays (A) with a complementary bit line ($\overline{B}_j$) in the other of the memory arrays ($\overline{A}$). Typically, each cell in each memory array (A, $\overline{A}$) comprises an MOS storage capacitor ($C_{jk}$, $\overline{C}_{jk}$, respectively, with $k=1, 2, 3, \ldots M$) connected at the corresponding crosspoint of the j'th bit line ($B_j$) and the k'th word line. Each such storage capacitor is electrically accessed through a separate MOS field effect transistor acting as an accessing switch.

During operation, each such capacitor can store a quantity of electrical charge suitable for representing an information state of the cell corresponding to a "full" cell or binary digital "1" state, or can store no electrical charge corresponding to an "empty" cell or binary digital "0" state. The determination as to which of the two possible states ("1" vs. "0") the cell represents at any time can be made by flip-flop detector ($FF_j$), one of whose terminals is connected to the same bit line ($B_j$) as that to which the capacitor is connected and the other of whose terminals is connected to a comparison or reference cell. Typically, the reference cell furnishes the flip-flop detector a reference voltage level ($v_m$) substantially midway between the voltages ($v_1$ and $v_0$) furnished by "full" and "empty" cells, that is, midway between "1" and "0". Thus, each flip-flop detector ($FF_j$) services all capacitive memory cells ($C_{jk}$ and $\overline{C}_{jk}$) on the same bit line and its complement ($B_j$ and $\overline{B}_j$), a total of 2M storage capacitors ($C_{jk}$ and $\overline{C}_{jk}$). More specifically, each flip-flop detector ($FF_j$) performs the detection operation by means of selective access connection of one of the storage capacitors ($C_{jk}$ or $\overline{C}_{jk}$) through the one corresponding bit line ($B_j$ or $\overline{B}_j$) and the simultaneous connection of the corresponding complementary bit line ($\overline{B}_j$ or $B_j$) to a corresponding reference cell which furnishes a suitable intermediate reference voltage for comparison purposes.

During the detection operation, the flip-flops are energized by a common latching pulse (common to all flip-flops), whereby each flip-flop ($FF_j$) (acting as a sense amplifier detector) goes into one of two possible states depending upon whether the voltage on the corresponding bit line ($B_j$ or $\overline{B}_j$) is greater vs. less than the voltage on the corresponding complementary bit line ($\overline{B}_j$ or $B_j$) and hence depending upon whether the voltage across the corresponding accessed storage capacitor ($C_{jk}$ or $\overline{C}_{jk}$) is greater vs. less than the voltage across the reference call, that is, depending upon whether the corresponding accessed storage capacitor ($C_{jk}$ or $\overline{C}_{jk}$) is in the digital "1" vs. digital "0" state. Typically, each such flip-flop ($FF_j$) comprises a pair of cross-coupled transistors ($Q_j$, $\overline{Q}_j$) feeding a pair of load transistors, whereby, when the flip-flops are energized by the latching pulse, one of the cross-coupled transistors ($Q_j$, $\overline{Q}_j$) in a given flip-flop is in the "on" state and the other is in the "off" state depending upon whether the accessed storage capacitor ($C_{jk}$ or $\overline{C}_{jk}$) is in the "1" or "0" state, and thus the one or the other load transistor will carry a large vs. small current. These load transistors are typically all energized (turned "on") by a pulse clock ($PC_2$) voltage applied to their gate electrodes after the latching pulse commences. In this way, each flip-flop ($FF_j$) amplifies the voltage difference, ($v_1 - v_n$) or ($v_2 - v_n$), between the voltage across the corresponding accessed storage capacitor ($v_1$ for a full cell, $v_0$ for an empty cell) and the intermediate reference voltage ($v_n$). This amplified voltage difference thus also appears across the corresponding bit line pair ($B_j$, $\overline{B}_j$) to which the flip-flop ($FF_j$) is connected.

Ordinarily, memory arrays in the semiconductor art are fabricated with three types or planes of electrical interconnections. One such plane of interconnection is afforded by impurity-diffused conductive lines, running along the surface of the semiconductive silicon body; the other two planes of interconnections are afforded by conductive lines defined by two separate levels of metallization located above, and insulated from, the surface of the silicon body. Typically, a lower metallization plane ("first level") is defined by polycrystalline silicon metallization lines and a higher metallization plane ("second level") is defined by aluminum metallization lines.

As the art has progressed, it has become possible in this type of metallization technology ("two-level MOS metallization") to arrange an array of charge storage cells (FIGS. 6 and 9), including storage capacitors ($C_{jk}$, $\overline{C}_{jk}$) plus accessing switches ($M_{jk}$, $\overline{M}_{jk}$), together with the bit lines ($B_j$, $\overline{B}_j$), in a compact configuration which occupies a transverse or lateral space having a width (in the direction transverse to the bit line direction) of as little as twice the minimum feature size (f) per cell, that is, a distance (2f) equal to twice the width of a minimum-width metallization line, or, more nearly precisely, a distance equal to the width of such a metallization line plus the width of a minimum-width gap between successive metallization lines; so that the entire array of memory cells together with the bit lines fits in a lateral space of 2Nf, or 2N times the minimum feature size. However, each flip-flop contains a pair of cross-connected transistors; and each transistor requires at least a source region, a gate region, and a drain region (i.e., at least three minimum features). Therefore, a straightforward two-level metallization arrangement or layout of N flip-flops together with required cross-connections of transistors in each pair plus interconnections to the corresponding bit lines ($B_j$, $\overline{B}_j$) would not result in a desired minimum geometry configuration of a total of but 2Nf or 2N feature sizes (measured in the transverse direction) for the entire array of the N flip-flops; rather, a transverse space of at least 3Nf or 3N feature sizes would be required to accommodate the flip-flops; thus, undesirable fanning-out of the bit lines would be required in order to connect them to the flip-flops—that is, an added semiconductor surface area requirement of the order of $N^2f$ (quadratic in N) precious semiconductor area. Therefore, it would be desirable to have a corresponding two-level metallization minimum geometry configuration for the flip-flop detectors, that is, an integrated circuit arrangement of N flip-flops which occupies a lateral space of only 2Nf, or 2N times the minimum feature size, so that the entire array of N flip-flops can fit within the same total amount of lateral space as that required for the memory cells. At the same time, it is important that the parasitic capacitance of each bit line ($B_j$) with respect to the flip-flop latching terminal be the same as that of its complement ($\overline{B}_j$), in order to afford proper balance in the detection process.

SUMMARY OF THE INVENTION

This invention involves an integrated circuit semiconductor memory apparatus comprising a plurality of N first bit lines ($B_1 \ldots B_N$, or $B_j$ with $j=1, 2, 3, \ldots N$) accessing a first memory array and an equal plurality of N complementary, second bit lines ($\overline{B}_1 \ldots \overline{B}_N$, or $\overline{B}_j$) accessing a second, complementary memory array, each first bit line ($B_j$) being connected through a separate flip-flop detector ($FF_j$) to a separate, complementary bit row line ($\overline{B}_j$), each said flip-flop ($FF_j$) comprising a separate pair of cross-coupled first and second MOSFET devices ($Q_j$, $\overline{Q}_j$), and each of said flip-flops ($FF_j$) having a latching terminal connected to a common flip-flop latching terminal (LT) through bus line connecting means for latching such flip-flops ($FF_j$) CHARACTERIZED IN THAT said bus line connecting means comprises first, second, and third electrically parallel conductive column latching lines ($L_1$, $L_2$, $L_3$), the gate electrode of each first MOSFET device ($Q_j$) being connected to the corrresponding bit row line ($B_j$), and the gate electrode of each second MOSFET device ($\overline{Q}_j$) connected to the corresponding complementary bit line ($\overline{B}_j$), the MOSFET devices ($Q_j$, $\overline{Q}_j$) of those flip-flops $FF_j$ satisfying $j=4i+1$ and $4i+4$—where i is 0 or a positive integer—being located between the first and second latching lines ($L_1$, $L_2$), and the MOSFET devices ($Q_j$, $\overline{Q}_j$) of those flip-flops $FF_j$ satisfying $j=4i+2$ and $4i+3$ being located between the second and third latching lines ($L_2$, $L_3$). In this way, a cell design is achieved in which both bit line addressing circuits, and charge sense or detecting circuits, all built with the same minimum feature size f, occupy no more lateral space than 2Nf or 2N times the minimum feature size f.

The provision of three latching lines affords opportunities for connecting the flip-flop latching terminal (LT) to the flip-flop sense amplifier detectors without still more cross-overs otherwise necessitated by locating these flip-flops in two columns, i.e., one column between $L_1$ and $L_2$, the other between $L_2$ and $L_3$. Since the electrical conductivity is highest in the second level metallization, each of the latching lines ($L_1$, $L_2$, $L_3$) is formed by a second level metallization line, in order to minimize power loss in these relatively high current-carrying latching lines. Each such latching line is of width w, except that the first and third latching lines ($L_1$, $L_3$) have widths 2W at locations or neighborhood regions of their respective cross-unders with respect to underlying bit lines $B_{4i+1}$, $\overline{B}_{4i+4}$ and $\overline{B}_{4i+2}$, $B_{4i+3}$. These underlying bit lines are typically formed, in the regions of cross-under, by first level polycrystalline metallization lines thereat. In this way, the total parasitic capacitance of each bit line $B_j$ with respect to the three latching lines ($L_1$, $L_2$, $L_3$) is the same as that of its complementary bit line $\overline{B}_j$, as is desirable for balanced flip-flop detector operation.

BRIEF DESCRIPTION OF THE DRAWING

This invention together with its features, advantages, and objects can be better understood from the following detailed description when read in conjunction with the drawings in which.

Elements in common or mutually equivalent in different drawings are indicated by the same reference labels.

In the plan view drawings (FIGS. 1, 3, 4, and 5), first level metallization lines (typically polycrystalline silicon), suitable for use as gate electrodes and as electrical interconnections, are indicated by random dot shading; second level metallization lines (typically aluminum), suitable for interconnections, are indicated by slant hatch lines running in a direction from lower-left to upper-right; and localized impurity diffused or implanted zones of relatively high conductivity located at the surface of underlying semiconductor, suitable for use as source and drain zones or as interconnections, are indicated by slant hatch lines running from upper-left to lower-right. Interconnection of a second level metallization with a first level metallization is indicated by a circle within a square; of a diffused zone with a first level metallization, by a rectangle within a rectangle; and of a second level metallization with a diffused zone, by a square within a square. This form of depiction of interconnections, however, is in no way intended to describe any details of actual geometry of any such interconnections.

DETAILED DESCRIPTION

Figure 1:
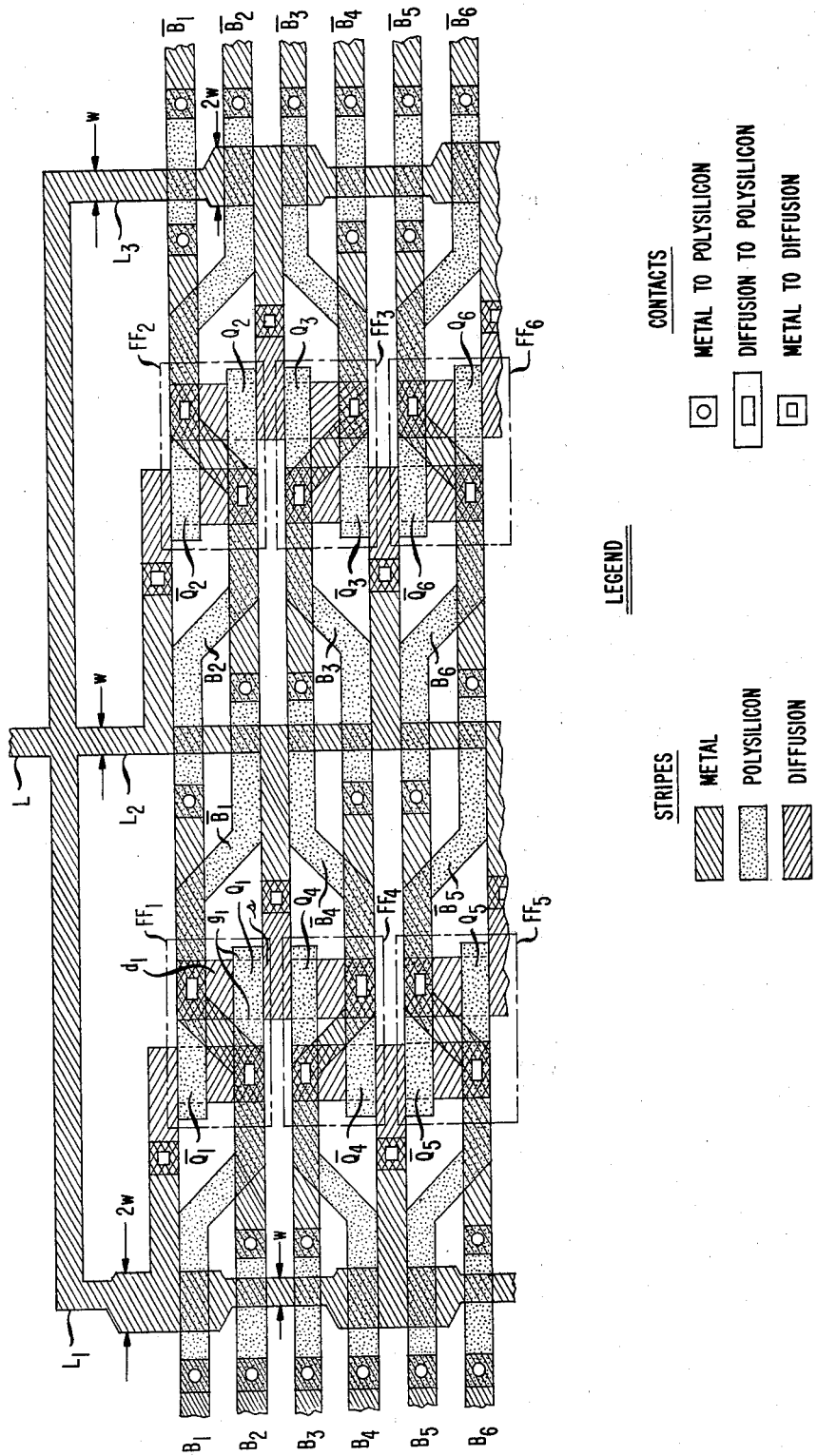
FIG. 1 is a plan view drawing of a minimum geometry array of flip-flop sense amplifier detectors in an integrated circuit configuration, useful in conjunction with memory arrays, in accordance with a specific embodiment of the invention.
Figure 2:
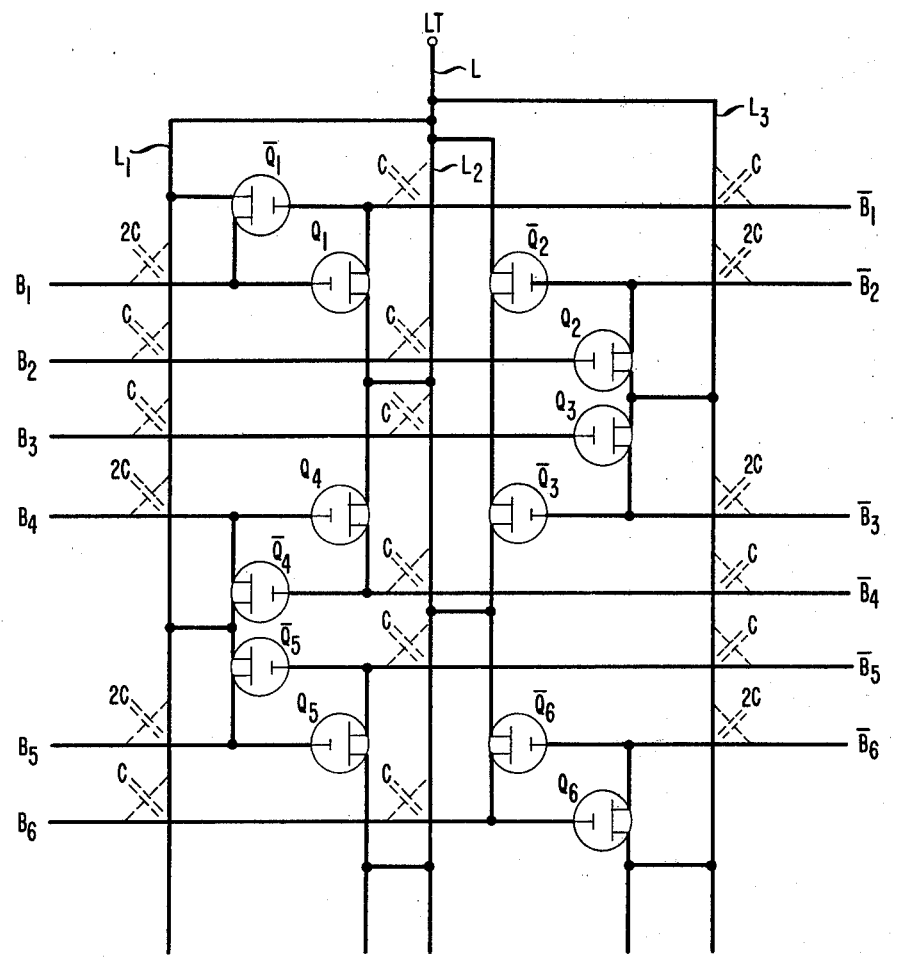
FIG. 2 is a schematic circuit diagram of the array illustrated in FIG. 1.

As indicated in FIGS. 1 and 2, a common latching line L is split into three parallel second level metallization column latching lines $L_1$, $L_2$ and $L_3$ connected to a common latching terminal LT. Portions of bit row lines $B_1$, $B_2$ ... $B_6$ enter at the left-hand side of the drawing as second level metallization lines connected to first level metallization lines; portions of complementary bit row lines $\overline{B}_1$, $\overline{B}_2$, ... $\overline{B}_6$ on the same respective rows as those of the bit row line portions $B_1$, $B_2$ ... $B_6$, enter at the right-hand side of the drawing, likewise as second level metallization lines connected to first level metallization lines. The MOSFET transistor $Q_1$ and its complementary MOSFET $\overline{Q_1}$ are cross-connected or cross-coupled to form a flip-flop sense amplifier $FF_1$; MOSFET transistors $Q_2$ and $\overline{Q_2}$ similarly form a flip-flop detector $FF_2$; . . . ; and $Q_6$ and $\overline{Q_6}$ similarly form a flip-flop detector $FF_6$. By "cross-coupled" is meant that the gate electrode of each $Q_j$ is connected to the drain of the complementary $\overline{Q_j}$, while the gate electrode of $\overline{Q_j}$ is connected to the drain of $Q_j$.

All transistors $Q_j$ and $\overline{Q_j}$ are integrated on a major surface of a silicon semiconductor body portion having a uniform bulk resistivity of one conductivity type except for the diffused or implanted zones of opposite conductivity type.

A gate electrode of a MOSFET, such as $g_1$ of $Q_1$ (FIG. 1), is provided by a first level metallization line $B_1$ at a location where it is separated by a relatively thin gate oxide from the surface of the underlying semiconductor body, and where it it flanked on either edge by a separate diffused zone, $s_1$ and $d_1$, serving as source and drain, respectively.

Each of the MOSFETs $Q_1 \ldots Q_6$, $\overline{Q_1} \ldots \overline{Q_6}$ thus has a gate electrode forming a low-current-carrying control terminal, and a source and a drain forming a pair of high-current-carrying terminals. The gate electrode of $Q_1$ is connected to $B_1$, that of $Q_2$ to $B_2$, . . . that of $Q_6$ to $B_6$; that of $\overline{Q_1}$ to $\overline{B_1}$, . . . , and that $\overline{Q_6}$ to $\overline{B_6}$. The state of flip-flop $FF_1$ is thus controlled by signals on bit lines $B_1$ and $\overline{B_1}$, the state of $FF_2$ by $B_2$ and $\overline{B_2}$, . . . and the state of $FF_6$ by $B_6$ and $\overline{B_6}$. It should be understood that the circuit patterns of FIGS. 1 and 2 can be repeated in a downward direction to accommodate any desired number of bit lines with corresponding flip-flop detectors.

The flip-flops $FF_1$, $FF_4$, and $FF_5$ (in general: $FF_{4i+1}$ and $FF_{4i+4}$ with $i=0$ or positive integer) are located between latching lines $L_1$ and $L_2$; whereas the flip-flops $FF_2$, $FF_3$, and $FF_6$ (in general: $FF_{4i+2}$, $FF_{4i+3}$) are located between latching lines $L_2$ and $L_3$. The source terminal of each of $\overline{Q_1}$, $\overline{Q_4}$ and $Q_5$ is connected to the common latching line L via $L_1$; the source terminal of $Q_1$, $Q_4$, $Q_5$, $\overline{Q_2}$, $\overline{Q_3}$, and $\overline{Q_6}$ to L via $L_2$; and the source terminal of $Q_2$, $Q_3$, and $Q_6$ to L via $L_3$. Each such source terminal thus serves as a local flip-flop latching activation terminal. Thereby, during operation, a common latching activation signal is communicated from the common latching terminal LT to all the flip-flops. A minimum geometry configuration of flip-flop detectors is thus obtained; namely, a geometry occupying no more lateral space than is occupied by the row bit lines which are themselves in the minimum geometry configuration (FIG. 2), that is, a geometry in which each row bit line requires a lateral space of but one metallization line plus one gap between the next neighboring metallization lines.

It is advantageous for sensitivity and balance in detection, as noted above, that the parasitic capacitance of each bit line $B_j$, caused by its overlap with the latching lines $L_1$, $L_2$, and $L_3$, be the same as that of its complementary bit line $\overline{B_j}$. Accordingly, the latching lines $L_1$ and $L_3$, respectively, are widened (FIG. 1) to double the size where bit lines $B_{4i+1}$, $B_{4i+4}$ and $B_{4i+2}$, $B_{4i+3}$ overlap them. Thereby, the parasitic capacitance of each bit line or its complement is always equal to 2C, either because of the double width 2w of the underlying latching line or because of two parallel capacitors, each of capacitance C formed by the underlying latching line $L_2$ plus either $L_1$ or $L_3$. For example, the bit row line $B_1$ has an overlap capacitance of 2C with respect to $L_1$, while its complementary line $\overline{B_1}$ has an overlap capacitance of C with respect to $L_2$ plus C with respect to $L_3$, for a total capacitance of 2C of the path from $B_1$ to $\overline{B_1}$ with respect to the latching lines.

Figure 3:
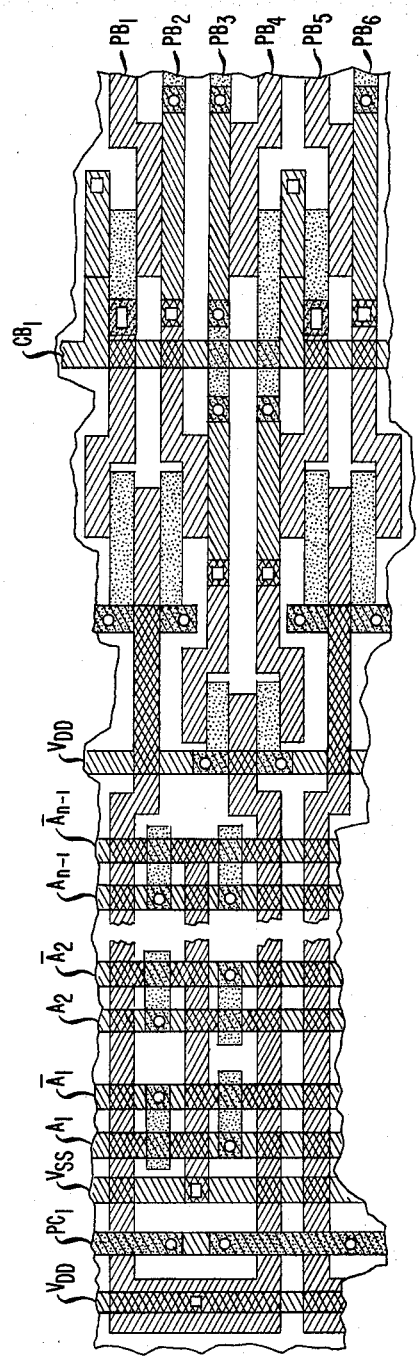
FIGS. 3, 4, and 5 are plan view drawings of an integrated circuit configuration suitable for use in conjunction with the array depicted in FIGS. 1 and 2.
Figure 4:
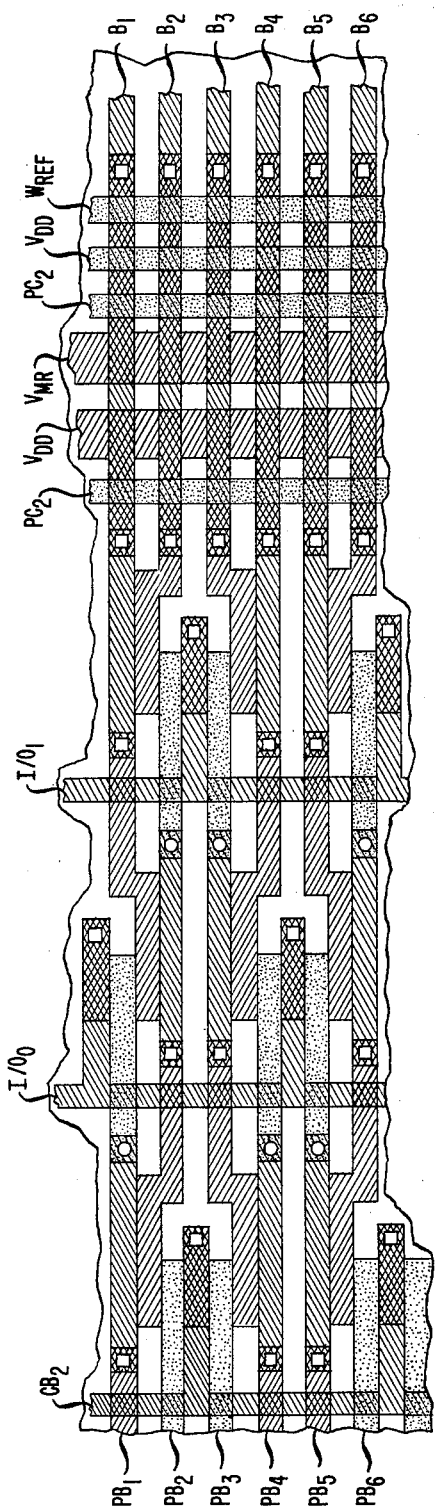
Figure 5:
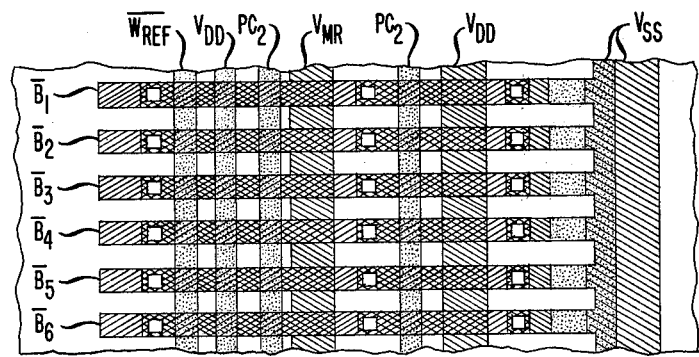
Figure 7:
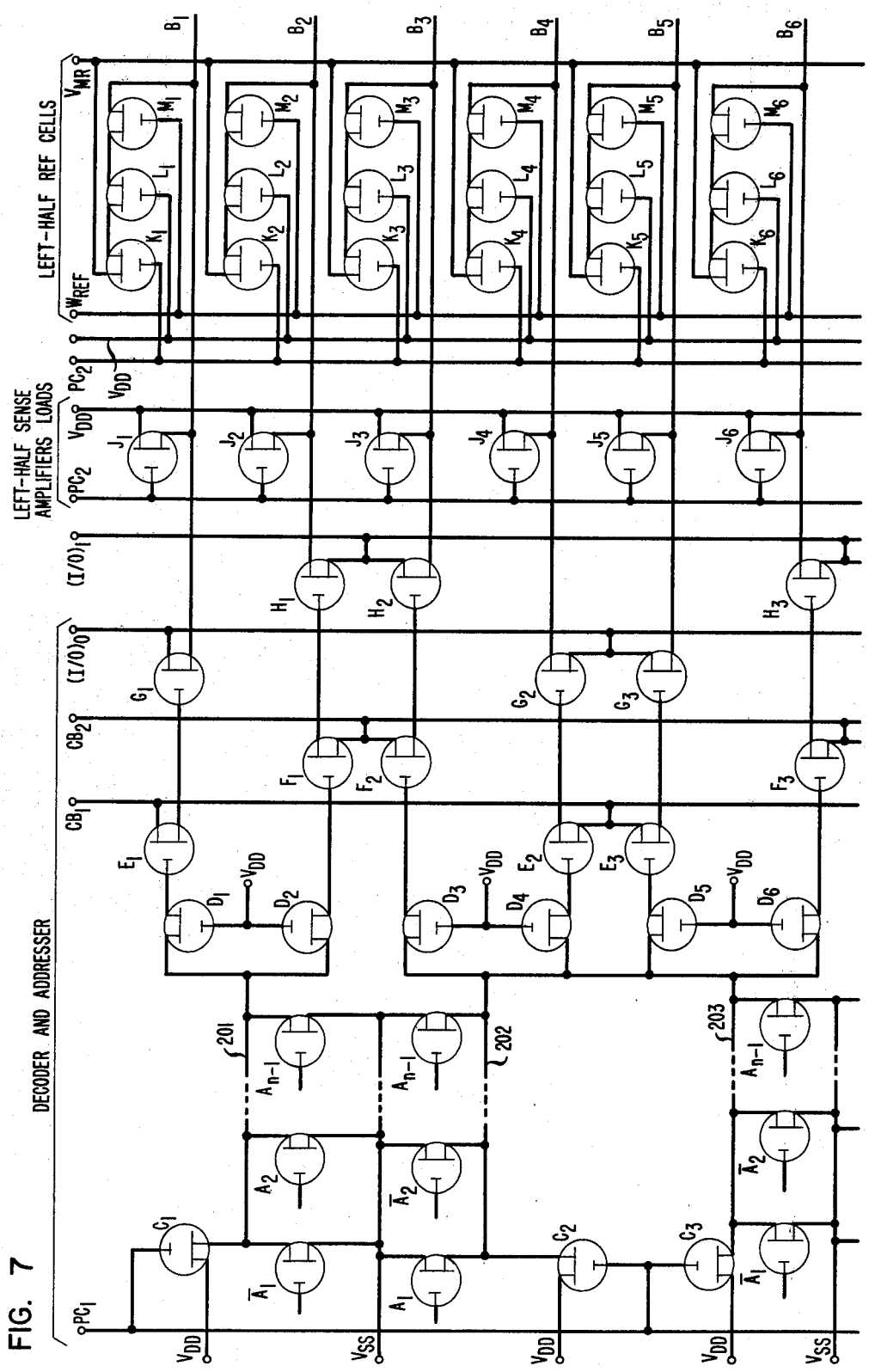
FIGS. 7 and 8 are schematic circuit diagrams of the intergrated circuit configuration illustrated in FIGS. 3, 4, and 5 plus the flip-flop sense amplifier detector array and memory arrays.
Figure 8:
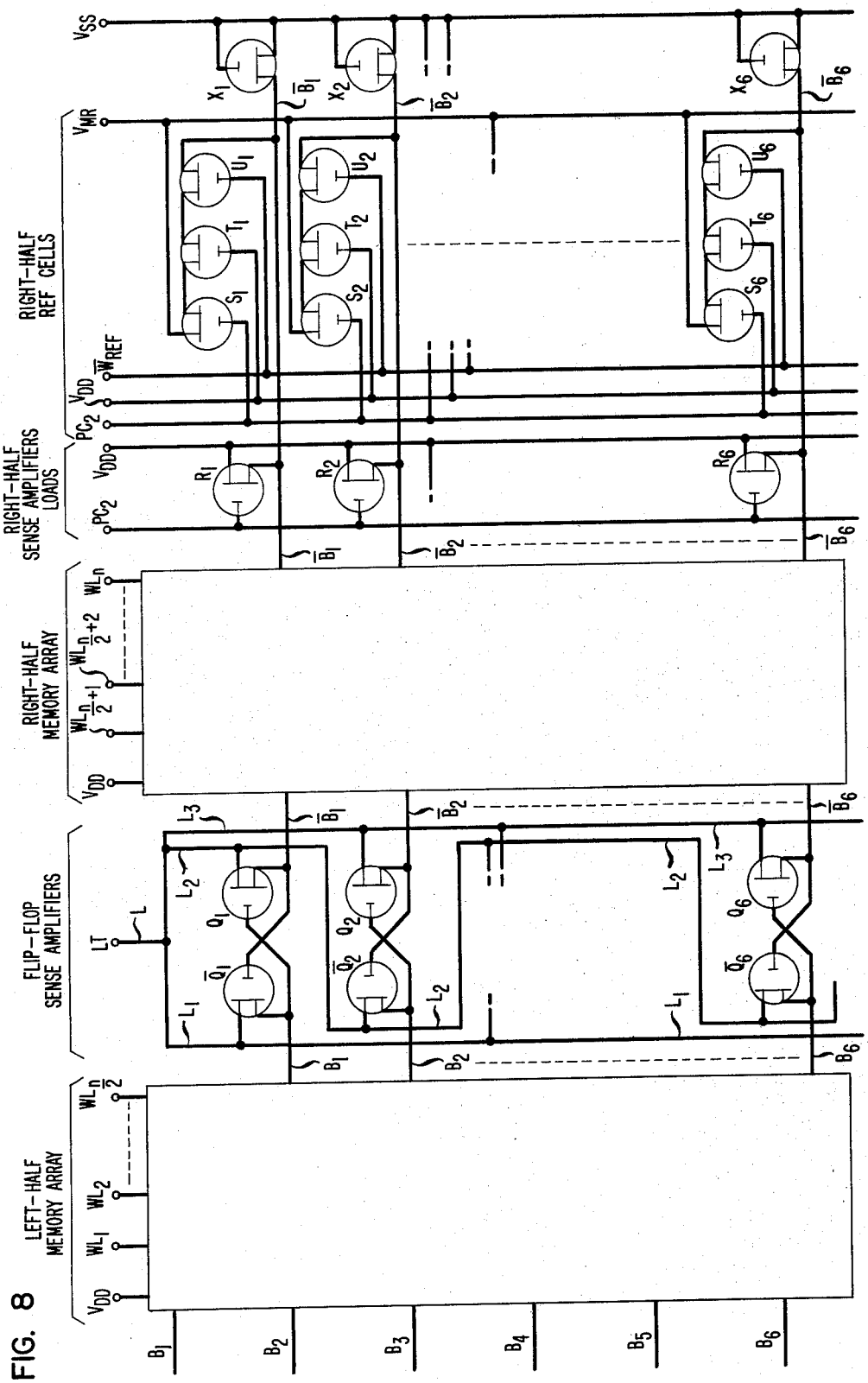

A plan view of a typical memory array integrated circuit layout for use in conjunction with the flip-flop sense amplifier detectors is illustrated in FIGS. 3, 4, and 5. A corresponding schematic circuit diagram thereof, further including the flip-flop sense amplifiers and memory arrays, is illustrated in FIGS. 7, 8. In a decoder and addresser portion (FIG. 3 and left-hand sides of FIGS. 4 and 7), a pulsed clock signal at terminal $PC_1$ is applied to transistors $C_1$, $C_2$, $C_3$ to turn them "on" and thus to precharge intermediate lines 201, 202, 203 towards a voltage $V_{DD}$. During and after termination of the "on" phase of the clock pluse signal $PC_1$, all but one of these intermediate lines 201, 202, 203 are discharged and brought to voltage $V_{SS}$ by the coded input transistors fed by input signals $A_1, A_2, \ldots A_{n-1}$, and their complements $\overline{A_1}, \overline{A_2}, \ldots \overline{A_{n-1}}$. Only one of the intermediate lines is charged to and remains at $V_{DD}$, specifically, that one line which is connected to the one complete row of coded input transistors all of which are "off". The determination of which one of these lines 201, 202, 203 is not brought to $V_{SS}$, but instead remains at $V_{DD}$, thus depends upon the instantaneous particular combination of (n−1) bi-level coded input transistors fed by these input signals and their complements, where (n−1) is the number of coded bi-level address inputs. For example, if any one (or more) of the signals $\overline{A_1}, A_2, \ldots A_{n-1}$ (corresponding to the row of input signal transistors for intermediate line 201) is "high" (turning "on" the corresponding input transistor), then during and after the "on" phase of the clock pulse $PC_1$, the corresponding input transistor discharges the line 201 towards $V_{SS}$; whereas if and only if all of $\overline{A_1}, A_2 \ldots A_{n-1}$ are "low" (turning "off" the corresponding input transistor), then the line 201 (and no other) goes to and remains at $V_{DD}$ during and after the "on" phase of clock pulse $PC_1$. Similarly, if $A_1, \overline{A_2}, \ldots A_{n-1}$ are all low, then the intermediate line 202 (and no other) goes to and remains at $V_{DD}$ during and after the "on" phase of $PC_1$. As is known in the art, there are $2^{n-1}$ possible combinations of (n−1) inputs and their complements i.e., $2^{n-1}$ binary ("high"-"low") input combinations. Hence, since there are N/2 intermediate lines 201, 202, 203, . . . , it follows that $2^{n-1}n=N/2$. For example, if N=64, there are 64/2 or 32 intermediate lines, and (n−1)=5 input transistors per row. But, in response to $PC_1$, only one of the intermediate lines thus goes to and remains at $V_{DD}$; the others remain at $V_{SS}$.

Additional bi-level input signals are applied to input lines $CB_1$ and $CB_2$. Each of the intermediate lines 201, 202, 203 is connected through a separate pair of load transistors $D_1$, $D_2$; $D_3$, $D_4$; $D_5$, $D_6$ to a gate of corresponding bi-level input transistors $E_1$, $F_1$; $E_2$, $F_2$; $E_3$, $F_3$. The high current (source-drain) path of each of these latter transistors connects the input lines $CB_1$ and $CB_2$ to the gates of bit row line access transistors $G_1$, $H_1$, $G_2$, $H_2$, $G_3$, $H_3$, respectively. Bit lines $B_1$, $B_4$, and $B_5$ are connected through the high current paths of bit row line access transistors $G_1$, $G_2$, $G_3$, respectively, to the input/output line $(I/O)_0$; whereas bit lines $B_2$, $B_3$, and $B_6$ are connected through the high current path of the bit row line access transistors $H_1$, $H_2$, and $H_3$, respectively, to the input/output line $(I/O)_1$.

During operation (FIG. 7), depending upon the respective "high" vs. "low" configuration of the bi-level inputs $A_1 \ldots A_{n-1}$, as indicated above, only a certain selected one of the intermediate lines 201, 202, 203 is substantially at potential $V_{DD}$ during and after the pulse on $PC_1$; the others are at $V_{SS}$. In turn, only the transistors ($E_1$, $F_1$; or $E_2$, $F_2$; or $E_3$, $F_3$; etc.) in the one pair corresponding to this selected intermediate line are "on"; all the transistors in the remaining pairs are "off". Accordingly, that one pair which is thus "on" enables the input signals on lines $CB_1$ and $CB_2$, respectively, to be applied to the gate electrodes of one corresponding pair of bit row line access transistors, G and H. Thus the one corresponding pair of bit row lines will be connected to input/output lines $(I/O)_0$ and $(I/O)_1$, respectively, provided further that the signals on lines $CB_1$ and $CB_2$ are such as to turn "on" the corresponding access transistor G and H, respectively.

For example, if the configuration of the $(n-1)$ inputs $A_1 \ldots A_{n-1}$ is such as not to discharge intermediate line 202 (and therefore such as to discharge all the remaining intermediate lines), then of all the intermediate lines 201, 202, 203, only the line 202 does not discharge to $V_{SS}$ after termination of the $PC_1$ pulse; so only the intermediate line 202 remains substantially at potential $V_{DD}$. Thus, of all the input transistor pairs $E_1 F_1$; $E_2 F_2$; $E_3 F_3$; only $E_2$ and $F_2$ are "on". Therefore, the input signals on lines $CB_1$ and $CB_2$, respectively, are applied through the high current paths of only $E_2$ and $F_2$ to the gate electrodes of only the bit row line access transistors $G_2$ and $H_2$. If and only if the bi-level value of the input signal on $CB_1$, as applied to the gate electrode only of $G_2$ through $E_2$, is such as to turn "on" $G_2$, then bit line $B_4$ and only bit line $B_4$ is connected to input/output line $(I/O)_0$. Similarly, if and only if the bi-level value of the input signal on $CB_2$, as applied to the gate electrode only of $H_2$ through $F_2$, is such as to turn "on" $H_2$, the bit line $B_3$ and only $B_3$ is connected to the input/output $(I/O)_1$. Thus, two-bit word access for reading and writing is provided by this arrangement.

Alternatively, for single-bit-word access, the input/output lines $(I/O)_0$ and $(I/O)_1$ are connected together to form a single input/output line, while the input signal on the line $CB_1$ is restricted to be the complement of the input signal on the line $CB_2$.

Further, as shown in FIG. 7, a transistor of the left-hand sense-amplifier array $J_1 \ldots J_6$ is connected to the bit lines $B_1 \ldots B_6$, each load clocked by $PC_2$.

To each of the bit lines $B_1 \ldots B_6$ is also connected (FIG. 7) a reference cell of a left-half array of reference cells, each cell typically comprising the series connection of an access transistor $M_1 \ldots M_6$ controlled by word line reference voltage $W_{REF}$, a capacitor formed by transistor $L_1 \ldots L_6$, and a clocked transistor $K_1 \ldots K_6$ controlled by $PC_2$ to whose source terminal is applied a suitable intermediate voltage reference $V_{MR}$. Thus, when $W_{REF}$ and $PC_2$ are both activated, the voltage $V_{MR}$ is applied to all the bit lines $B_1 \ldots B_6$ through loads $L_1 \ldots L_6$, respectively. Typically, $V_{MR}$ is about 2.5 volts; $V_{DD}$ is about 5.0 volts, with $V_{SS}=0$.

Each of the bit lines $B_1 \ldots B_6$ is also connected to a separate horizontal line array of minimum geometry memory storage cells. Thereby, a two-dimensional left-half memory array of MOS capacitor storage cells is formed. Access to the individual cells is controlled through separate connection through the high current paths of conventional MOS access transistors (not shown) whose gates are controlled by word lines $WL_1 \ldots WL_{M/2}$; that is, only when word lines $WL_k$ is activated do the storage cells $C_{jk}$ on that same word line (column) become connected to the corresponding bit line $B_j (j=1, 2 \ldots 6)$.

Each bit row line $B_j$ is also connected to a (left-hand) input terminal of the corresponding flip-flop on the corresponding row (FIG. 8), activated by latching line L. At the other (right-hand) terminals of the flip-flops are connected the corresponding complementary bit row line $\overline{B}_1 \ldots \overline{B}_6$.

It should be noted that only in FIG. 8 is the flip-flop latching line $L_2$ depicted in a zig-zag (crooked) pattern rather than a straight line; but this crooked pattern arises only out of the purpose of ease of recognition, presenting the diagram of the cross-coupled flip-flop transistors in a more simple and easily recognizable manner in this FIG. 8.

The complementary bit lines $\overline{B}_1 \ldots \overline{B}_6$ are connected to the right-half memory array of storage cells with access controlled by word lines $WL_{M/2+1} \ldots WL_M$, to right-half sense amplifier loads $R_1 \ldots R_6$, to right-half reference cells $S_1 T_1 U_1 \ldots S_6 T_6 U_6$ with access controlled by $\overline{W}_{REF}$, the complement of $W_{REF}$, in similar manner as, respectively, the bit lines $B_1 \ldots B_6$ are connected to the left-half memory array, with access controlled by word lines $WL_1 \ldots WL_{M/2}$, the left-half sense amplifier loads $J_1 \ldots J_6$, and the left-half reference cells with access controlled by $W_{REF}$. Transistors $X_1 \ldots X_6$ are useful for providing capacitance to the respective bit lines $\overline{B}_1 \ldots \overline{B}_6$ in order to balance the capacitances of the corresponding transistors $G_1, H_1, \ldots G_3, H_3$. Thus, by appropriate selection of $W_{REF}$, whenever a bit line $B_1 \ldots B_6$ accesses a left-hand storage cell by virtue of activaton of a word line $WL_1 \ldots WL_{M/2}$, its complementary bit row line $\overline{B}_1 \ldots \overline{B}_6$ accesses a right-hand reference cell; and whenever a complementary bit row line $\overline{B}_1 \ldots \overline{B}_6$ accesses a right-hand storage cell by virtue of activation of a word line $WL_{n/2+1} \ldots WL_n$, its corresponding bit row line $B_1 \ldots B_6$ on the same row accesses a left-hand storage cell. In this manner, each of the flip-flops senses and amplifies the difference between the voltage produced by the charge in a selected cell in the memory array on one side (left or right half) and the voltage produced by the charge in a reference cell on the other side (right or left half), as is ordinarily desired in sense amplifier operation.

Figure 6:
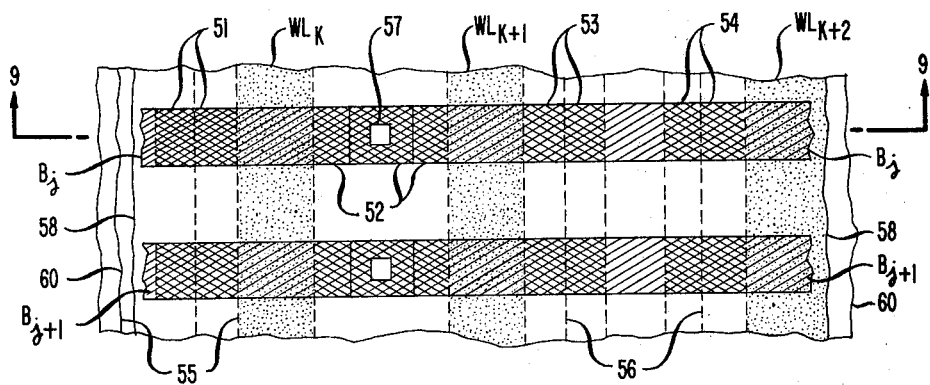
FIG. 6 is a plan view of an illustrative example of a semiconductor memory cell array portion, useful in the circuit shown in FIGS. 7 and 8.
Figures 9, 10, 11:
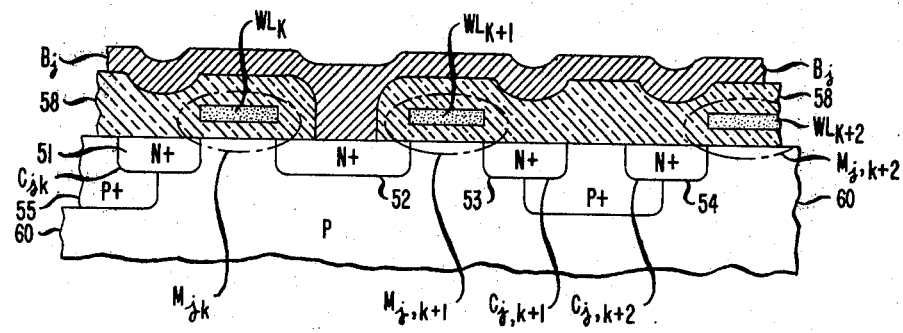
FIG. 9 is a view of a cross section of FIG. 6.
FIG. 10 is a block diagram showing the spatial relation between FIGS. 3, 4, and 5.
FIG. 11 is a block diagram showing the spatial relation between FIGS. 7 and 8.

FIGS. 6 and 9 show a portion of a memory cell array which can be used in the left-half and right-half memory arrays in the circuit shown in FIG. 8. Each of the memory storage capacitors $C_{jk}$ is formed by a PN junction, each junction formed by an interface with P-type semiconductor of one of N+ zones 51, 53, 54 located at a major surface of a P-type semiconductor body 60. The capacitances $C_{jk}$ are enhanced by auxiliary P+ zones 55, 56. Bit line $B_j$ contacts an N+ zone 52 through an aperture 57 in an oxide layer 58. Word lines $WL_k$ are formed by polycrystalline silicon stripes which serve as gate electrodes controlling the surface channels between pairs of adjacent underlying N+ zones 51, 52 and 52, 53.

Although the invention has been described in detail in terms of a specific embodiment, various modifications can be made without departing from the scope of the invention. It should be understood, in particular, that the layouts and circuits indicated in FIGS. 3, 4, 5, and 7, 8 are illustrative of only one particular configuration, and that other configurations can be used in conjunction with the sense amplifier layout shown in FIGS. 1 and 2. The column latching line $L_2$, for example, can equivalently be split into two neighboring parallel column lines, the right-hand one of these lines being connected to the right-hand column of detectors (FF$_2$, FF$_3$, FF$_6$ . . . ) and the left-hand one of these lines being connected to the left-hand column of detectors (FF$_1$, FF$_4$, FF$_5$ . . . ).

What is claimed is:

1. An integrated circuit semiconductor memory apparatus comprising a plurality of first bit lines (B$_j$) for accessing a first memory array and an equal plurality of second, complementary bit lines ($\overline{B_j}$) for a second memory array, an equal plurality of flip-flop detectors (FF$_j$) each of such flip-flops (FF$_j$) having a separate pair of input detecting terminals one of which is connected to a corresponding first bit line (B$_j$) and the other of which is connected to a corresponding complementary bit line ($\overline{B_j}$), and each of such flip-flops (FF$_j$) having a latching terminal connected to a common latching terminal (LT) through bus line connecting means for latching such flip-flops (FF$_j$) characterized in that said bus line connecting means comprises first, second, and third electrically parallel conductive column latching lines (L$_1$, L$_2$, L$_3$), the flip-flops FF$_j$ satisfying j=4i+1 and 4i+4, where i is 0 or a positive integer, comprising a separate cross-coupled pair of first and second MOSFETs (Q$_j$ and $\overline{Q_j}$) located between the first and second latching lines (L$_1$, L$_2$), and the flip-flops FF$_j$ satisfying j=4i+2 and 4i+3 comprising a separate cross-coupled pair of third and fourth MOSFETs (Q$_j$ and $\overline{Q_j}$) located between the second and third latching lines (L$_2$, L$_3$), the corresponding pair of gate electrodes of every such pair of MOSFETs (Q$_j$ and $\overline{Q_j}$) serving as the pair of input detecting terminals for the corresponding flip-flop (FF$_j$).

2. Apparatus according to claim 1 in which each of the latching lines (L$_1$, L$_2$, L$_3$) is formed by a metallization line of width w overlying and insulated from a major surface of a semiconductor body, except that the first and third latching lines (L$_1$, L$_3$) have widths 2w at locations of their respective crossings with respect to bit lines B$_{4i+1}$, B$_{4i+4}$ and $\overline{B}_{4i+2}$, $\overline{B}_{4i+3}$.

3. Apparatus according to claim 2 in which all said bit row lines (B$_j$, $\overline{B_j}$) are formed by first level metallization lines at the location of every crossing with respect to any of the latching lines (L$_1$, L$_2$, L$_3$), the latching lines at least at every such location being second level metallization lines.

4. Apparatus according to claims 1, 2, or 3 in which the gates of the first and third MOSFETs ($\overline{Q}_{4i+1}$ and $\overline{Q}_{4i+2}$) of the flip-flops FF$_j$ satisfying j=4i+1 and j=4i+2, respectively, are confined within the longitudinal extension of the semiconductor surface encompassed by the bit line B$_{4i+2}$, and in which the gates of the second and fourth MOSFETs (Q$_{4i+1}$ and Q$_{4i+2}$) of the flip-flops FF$_j$ satisfying j=4i+1 and j=4i+2, respectively, are confined within the longitudinal extension of surface encompassed by the bit line B$_{4i+1}$, and in which each of the bit lines B$_j$ is located on the longitudinal extension of said surface encompassed by the bit line B$_j$.

5. Apparatus according to claim 4 in which the gates of the third and first MOSFETs (Q$_{4i+3}$ and Q$_{4i+4}$) of the flip-flops FF$_j$ satisfying j=4i+3 and j=4i+4, respectively, are located on the longitudinal extension of the bit line B$_{4i+3}$ and in which the gates of the fourth and second MOSFETs ($\overline{Q}_{4i+3}$ and $\overline{Q}_{4i+4}$) of the flip-flops FF$_j$ satisfying j=4i+3 and j=4i+4, respectively, are located on the longitudinal extension of the bit line B$_{4i+4}$.

6. Semiconductor apparatus comprising a semiconductor circuit in a two-level metallization configuration including:
   (a) a plurality of first bit row lines (B$_j$);
   (b) an equal plurality of second bit row lines ($\overline{B_j}$);
   (c) an equal plurality of flip-flop detectors (FF$_j$), each comprising a cross-coupled pair of first and second MOSFETs (Q$_j$ and $\overline{Q_j}$), the gate electrode of each of such first MOSFETs (Q$_j$) being connected to a corresponding bit line (B$_j$) of the first bit row lines, and the gate electrode of each of such second MOSFETs ($\overline{Q_j}$) being connected to a corresponding bit line ($\overline{B_j}$) of the second bit row lines;
   (d) first, second, and third electrically parallel column latching lines (L$_1$, L$_2$, L$_3$) for activating the flip-flops (FF$_j$), the first and second MOSFETs (Q$_j$ and Q$_j$) in a first set of alternating successive pairs of flip-flops (FF$_j$)—with j=4i+2 and j=4i+3, i being 0 or positive integer—being located between the second and third latching lines (L$_2$, L$_3$), the first and second MOSFETs (Q$_j$, $\overline{Q_j}$) of a second, remaining set of flip-flops (FF$_j$)—with j=4i and j=4i+1—being located between the first and second latching lines (L$_1$, L$_2$).

7. Apparatus according to claim 6 in which a source terminal of each of the first MOSFETs (Q$_j$) in the first set is connected to the latching terminal (LT) through the third latching line (L$_3$), a source terminal of each of the second MOSFETs ($\overline{Q_j}$) in the first set and of each of the first MOSFETs (Q$_j$) in the second set are connected to the latching terminal (LT) through the second latching line (L$_2$), and a source terminal of each of the second MOSFETs ($\overline{Q_j}$) in the second set is connected to the latching terminal (LT) through the first latching line (L$_1$).

8. Apparatus according to claim 6 or 7 in which the gate of each of the first MOSFETs (Q$_j$) in said second set is located on the same row as that on which is located that portion of the corresponding bit row line (B$_j$) to which said gate electrode of said first MOSFET (Q$_j$) is connected, and the gate of each of the second MOSFETs ($\overline{Q_j}$) in said second set is located on the same row as that on which is located that portion of the corresponding second bit row line ($\overline{B_j}$) to which said gate electrode of said second MOSFET ($\overline{Q_j}$) is connected, and in which each said portion of each of the second bit row lines ($\overline{B_j}$) is located on the same row as that on which said portion of the corresponding first bit row line (B$_j$) is located.

9. An integrated circuit semiconductor memory detector circuit comprising a plurality of memory accessing parallel bit lines located on the left-hand side thereof and an equal plurality of memory accessing parallel bit lines located on the right-hand side thereof, thereby forming complementary bit line pairs; an equal plurality of detectors forming a detector array, one such detector associated with a corresponding pair of complementary bit lines, each such detector having one input detecting terminal connected to its corresponding left-hand bit line and another input detecting terminal connected to its corresponding right-hand bit line; and means for connecting all of the detectors to a common latch terminal characterized in that said detectors are arranged in a left-hand and a right-hand column located between said left-hand and right-hand pluralities of bit lines; and said common latch terminal connecting means comprises first, second, and third parallel column latch lines perpendicular to said bit lines, the second column latch line being located between said left-hand and right-hand columns of detectors, the first column latch line being located on the left-hand side of said left-hand column of detectors, and the third latch line being located on the right-hand side of said right-hand column of detectors, each such detector being electrically connected to its corresponding pair of complementary bit lines and to the two column lines located on the two sides thereof.

10. An integrated circuit semiconductor memory detector circuit in accordance with claim 9 wherein successive detector couplets (e.g., $FF_1$, $FF_2$) associated with successively disposed bit line pair couplets ($B_1 \overline{B_1}$, $B_2 \overline{B_2}$) are confined to the extension of semiconductor surface encompassed by said bit line pair couplets, with the two detectors in each couplet being located in different detector columns.

11. An integrated circuit semiconductor memory detector circuit in accordance with claim 10 wherein successive detectors ($FF_2$, $FF_3$) associated with successively disposed bit line pair couplets ($B_2 \overline{B_2}$, $B_3 \overline{B_3}$) contained in different couplets are located in the same detector column.

12. A circuit according to claim 9, 10, or 11 in which each detector comprises a separate pair of cross-coupled MOS transistors, the transverse size of the detector array being the same as that of the plurality of bit lines.

* * * * *

UNITED STATES PATENT AND TRADEMARK OFFICE
CERTIFICATE OF CORRECTION

PATENT NO. : 4,402,063

DATED : August 30, 1983

INVENTOR(S) : Norman C. Wittwer

It is certified that error appears in the above-identified patent and that said Letters Patent is hereby corrected as shown below:

In column 1, line 17, "betwee" should read --between--; line 24, "$\bar{B}_j$" should read --$B_j$--; line 26, "$(\bar{A})$" should read --$(A)$--; line 27, "$(B_j)$" should read --$(\bar{B}_j)$--; line 27, "$(A)$" should read --$(\bar{A})$--; line 52, "$(B_j$ and $B_j)$" should read --$(B_j$ and $\bar{B}_j)$--; line 59, "$(B_j$ or $B_j)$" should read --$(\bar{B}_j$ or $B_j)$--. Column 3, line 15, "$(B_j)$" should read --$(\bar{B}_j)$--; line 29, "$(Q_j, Q_j)$" should read --$(Q_j, \bar{Q}_j)$--; line 63, "2W" should read --2w--; line 65, "$\bar{B}_{4i+4}$" should read --$B_{4i+4}$--; line 65, "$B_{4i+3}$" should read --$\bar{B}_{4i+3}$--. Column 5, line 27, "$B_6$", second occurrence, should read --$\bar{B}_6$--; line 29, "$B_1$" should read --$\bar{B}_1$--; line 29, "$B_2$" 2nd occurrence should read --$\bar{B}_2$--; line 39, "$Q_5$" should read --$\bar{Q}_5$--. Column 6, line 1, "$B_1$"

UNITED STATES PATENT AND TRADEMARK OFFICE
CERTIFICATE OF CORRECTION

PATENT NO. : 4,402,063

DATED : August 30, 1983

INVENTOR(S) : Norman C. Wittwer

It is certified that error appears in the above-identified patent and that said Letters Patent is hereby corrected as shown below:

should read $--\bar{B}_1--$; line 44, after "complements" insert a comma. Column 7, line 67, "lines" should read --line--. Column 8, line 16, "$B_1$" should read $--\bar{B}_1--$; line 16, "$B_6$" should read $--\bar{B}_6--$; line 21, "$W_{REF}$", first occurrence, should read $--\bar{W}_{REF}--$. Column 9, line 19, "characterized in that" should read --CHARACTERIZED IN THAT--; line 48, "$Q_{4i+1}$" should read $--\bar{Q}_{4i+1}--$; line 49, "$Q_{4i+2}$" should read $--Q_{4i+2}--$; line 53, "$Q_{4i+1}$" should read $--\bar{Q}_{4i+1}--$; line 53, "$Q_{4i+2}$" should read $--\bar{Q}_{4i+2}--$; line 59, "$B_j$" should read $--\bar{B}_j--$. Column 10, line 17, "$Q_j$" should read $--\bar{Q}_j--$; line 63, "characterized in that" should read --CHARACTERIZED IN THAT--.

Signed and Sealed this

*Fifteenth* Day of *November 1983*

[SEAL]

*Attest:*

GERALD J. MOSSINGHOFF

*Attesting Officer*     *Commissioner of Patents and Trademarks*